US006734512B2

(12) United States Patent
Suzuki

(10) Patent No.: US 6,734,512 B2
(45) Date of Patent: May 11, 2004

(54) ELECTROSTATIC ACTUATOR

(75) Inventor: Kenichiro Suzuki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/279,192

(22) Filed: Oct. 23, 2002

(65) Prior Publication Data

US 2003/0076006 A1 Apr. 24, 2003

(30) Foreign Application Priority Data

Oct. 24, 2001 (JP) ....................................... 2001-326102

(51) Int. Cl.[7] ......................... H01L 29/82; H01L 29/84; H01L 27/14

(52) U.S. Cl. ....................... 257/414; 257/401; 257/415; 257/421

(58) Field of Search ................................. 257/400–414

(56) References Cited

U.S. PATENT DOCUMENTS

| | | | | |
|---|---|---|---|---|
| 4,528,583 A | | 7/1985 | te Velde et al. | |
| 5,214,727 A | * | 5/1993 | Carr et al. | 385/22 |
| 5,619,061 A | | 4/1997 | Goldsmith et al. | |
| 6,064,126 A | * | 5/2000 | Beardmore | 307/112 |
| 6,537,437 B1 | * | 3/2003 | Galambos et al. | 204/600 |
| 6,396,371 B2 | * | 5/2003 | Streetcar et al. | 335/78 |
| 6,563,106 B1 | * | 5/2003 | Bowers et al. | 250/216 |
| 2002/0176653 A1 | * | 11/2002 | Katayama et al. | 385/16 |

FOREIGN PATENT DOCUMENTS

| | | |
|---|---|---|
| DE | 42 24 599 A1 | 2/1994 |
| JP | 9 180616 A | 7/1997 |
| JP | 11 176307 A | 7/1999 |

OTHER PUBLICATIONS

Dominique Chauvel et al., "A Micro–Machined Microwave Antenna Integrated With Its Electrostatic Spatial Scanning", *LIMMS/CNRS–IIS, Institute of Industrial Science*, The University of Tokyo, pp. 84–89 (1997).

* cited by examiner

*Primary Examiner*—Jerome Jackson
*Assistant Examiner*—Jessie A. Fenty
(74) *Attorney, Agent, or Firm*—Choate, Hall & Stewart

(57) ABSTRACT

An electrostatic actuator has: an upper structure that is connected, via an arm, to a supporting base provided on a substrate and is supported in a space existing over the substrate; a lower structure that is provided in a substrate position in such a way as to oppose the upper structure; an inclination structure that is provided with respect to either one of the upper structure and the lower structure so as to make small the distance between the upper structure and the lower structure; and one or more electrodes that are provided with respect to the other structure in corresponding relationship to the inclination structure.

6 Claims, 8 Drawing Sheets

PLAN VIEW

AA' SECTION

BB' SECTION

PLAN VIEW

AA' SECTION

BB' SECTION

PLAN VIEW

AA' SECTION

OR

ELECTROSTATIC ACTUATOR

FIELD OF THE INVENTION

The present invention relates to an electrostatic actuator which is manufactured using an MEMS (Micro Electro-Mechanical Systems) technique and, more particularly, to an electrostatic actuator which is applied to a micro switch for turning on or off a wide band signal frequency of from DC to several hundreds of GHz, a light switch for switching the direction of a light signal according to the inclination of the mirror, a scanner for switching the direction of a relevant wireless antenna, etc.

BACKGROUND OF THE INVENTION

A conventional technique will now be explained by taking up as an example thereof a technique and device that are described in a treatise entitled "A Micro-Machined Micro-wave Antenna Integrated with its Electrostatic Spatial Scanning" (Proceedings of IEEE Micro Electro Mechanical Systems, Nagoya, pp. 84–89, 1997), pronounced in the IEEE 10th Micro Electro Mechanical Systems International Conference by Dominique Chauver et al. of Tokyo Univ. LIMMS/SNRS-II.

A perspective view of this device is illustrated in FIG. 1. In this device, a quartz substrate 610 is machined to form a torsional vibration plate 611 and springs 613 that support both ends of the vibration plate 611. On the upside surface of the torsional vibration plate 611, there is provided an upper electrode 612 consisting of a chrome/gold material, and this upper electrode 612 is electrically connected to a contact pad 614 through the intermediary of a wiring 615, on the other hand, with respect to a silicon substrate 620, there is formed an inclination structure 621. Chauver et al. formed the inclination structure 621 having two inclined surfaces the angle of inclination of that is 35.3° by performing anisotropic wet etching with respect to a silicon substrate having a (110) Si crystal face. They formed two electrode patterns, lower electrodes 622*a* and 622*b* each made of chrome, respectively, on those two inclined surfaces. These lower electrodes 622*a* and 622*b* are respectively electrically connected to contact pads 624*a* and 624*b*. These quartz substrate 610 and silicon substrate 620 are bonded together in the way of being aligned with each other such that the torsional vibration plate 611 may be located over the inclination structure 621 (provided, however, that the method of bonding is not described).

Applying a voltage between the upper electrode 612 and the lower electrode 622*a* or 622*b*, due to the electrostatic attracting force an attractive force that acts toward the substrate (downside) occurs in the torsional vibration plate 611. For this reason, the springs 613 are torsion-deformed (twisted), with the result that the torsional vibration plate 611 rotates about the springs 613 and gets inclined. By varying the voltage applied between the upper electrode 612 and the lower electrode 622*a* or 622*b*, it is possible to adjust the rotation angle of the torsional vibration plate 611. Also, by selecting which of the lower electrodes 622*a* and 622*b* a voltage is applied to, it is possible to change the rotation direction of the torsional vibration plate 611.

In this conventional technique, the application of the device to an antenna that changes the transmission direction or reception direction of a radio signal by varying the rotation direction of the torsional vibration plate 611 was stated. What is particularly noticeable is that by forming the lower electrode into an inclination structure it is possible to decrease the voltage that is applied. This is based on the principle that, since an electrostatic attracting force decreases in inverse proportion to the square of the distance between two structures, if the device can be designed so as to make small the distance between the upper electrode and the lower electrode, the voltage that is applied can be made small. When the rotation angle of the torsional vibration plate 611 is zero, a large electrostatic attracting force occurs between the upper electrode region and the lower electrode 622*a*/622*b* region the lower electrode portion of that is provided at the position that is near the apex of the inclination structure 621. As the torsional vibration plate 611 rotates, a large electrostatic attracting force also goes on occurring in the other regional portion, as well, of the lower electrode 622*a*/622*b*. If the lower electrode 622*a*/622*b* is provided on a flat surface having no inclination structure 621, since the distance between the upper electrode and the lower electrode is large, a high level of voltage is needed for the purpose of rotating the torsional vibration plate 611. Although Chauver et al. do not concretely state that effect of the inclination structure, calculating the electrostatic attracting force in relation to the inclination structure of 35.3°, it proved that the voltage that is applied can be decreased approximately 30% with respect to the flat structure.

Also, although Chauver et al. do not state, the second effect of the inclination structure 621 is to make more likely to occur the rotational movement about the springs 613 of the torsional vibration plate 611. When applying a voltage between the upper electrode 612 and the lower electrode 622*a*/622*b*, a force that acts toward the lower electrode occurs in the upper electrode 612. However, in a case where the rigidity of the bending deformation of the springs 613 is smaller than the rigidity of the rotation (torsion), the tendency to deform toward the silicon substrate 620 side perpendicularly with respect thereto becomes more likely to occur than the tendency to rotate. The inclination structure 621 plays the role of preventing that perpendicular deformation and causing only the rotational movement alone to occur in the torsional vibration plate 611.

FIGS. 2A to 2D are sectional views illustrating a method of manufacturing the structure on the silicon substrate side according to the above-described conventional technique. A silicon nitride film 72*a* and a silicon nitride film 72*b* are deposited on both surfaces, respectively, of a silicon substrate 71 the (110) Si crystal face of that serves as a principal surface by using a low-pressure vapor phase epitaxy (LP-CVD). And, with respect to one surface of them, patterning of the nitride film 72*a* is performed using a photolithography technique (the same figure A). This substrate is put into a 33% solution of KOH, thereby performing anisotropic etching with respect to the silicon substrate 71. As a result of this, an inclination structure 73 having an inclination of 35.3° with respect to the flat surface is formed (the same figure B). Subsequently, on the surface of the silicon substrate having this inclination structure 73, by sputtering, a silicon oxide film is deposited. A metal mask 76 is disposed on this resulting substrate, then chrome is deposited. At this time, through the openings formed in the metal mask 76, the chrome is deposited on the inclination structure, thereby a lower electrode 75 can be formed (the same figure C). Thereafter, again, by sputtering, a silicon oxide film 77 is deposited on the chrome lower electrode 75 (the same figure D). Finally, a torsional vibration plate formed by machining a quartz substrate is bonded onto that silicon substrate 71, thereby the device illustrated in FIG. 1 is manufactured.

In this conventional technique, the torsional vibration plate had a dimension of 1×2×0.1 mm. Especially, for the reason why the torsional vibration plate having a width as great as 2 mm is designed to be inclined ±10, it was necessary to construct so that the height of the inclination structure may be equal to or more than 175 $\mu$m. For forming the lower electrode pattern on the substrate having a level difference that is as great as that height, Chauver et al. adopted the chrome deposition method utilizing a metal mask 76 such as that illustrated in FIG. 2C. However, due to the existence of a clearance between the metal mask 76 and the inclination structure 75, it is difficult to form the lower electrode 75 with the dimensions as designed, and at the position as designed. This is because, since the chrome particles that have gone out from the target of the deposition device collide with the substrate at a certain angle of spread, the fact that the distance between the substrate and the target varies, if happening, causes a shift of the collision position from their proper one. In this conventional technique, as the position gets shifted from the apex of the inclination structure, the distance between the inclined surface and the target gets increased. This raised the problem that the pattern became different from the metal mask. In the electrostatically driven actuator, its characteristic is very highly sensitively affected by the configurations of the upper/lower electrodes and positional relationship therebetween. On that account, when evaluating the torsion angle in relation to the driving voltage by using the device according to the conventional technique, it proved that the characteristic greatly varied between the devices.

The problem that the lower electrode pattern cannot be formed faithfully according to the mask can not be solved even when using the method of forming a resist pattern directly with respect to the inclination structure. This is because, in this case, transferring the photo-mask pattern faithfully with respect to the inclined surface of the inclination structure is very difficult on account of a limitation existing when accurately obtaining the focal distance of the optical system of a relevant exposure device. Also, it is difficult to evenly coat the resist with respect to the inclination structure, too.

For the above-described reasons, despite the merit of the inclination structure being able to decrease the voltage that is applied, because it is difficult to accurately form the electrode pattern on the inclination structure, there was the problem that it was difficult to manufacture a device that was reliable and the characteristic of that was uniformly qualified. For this reason, it was not only impossible to supply a uniformly qualified quality of the products in large amount as the mass-production goods but was it difficult to utilize the inclination structure with respect to the use purposes including a high-function antenna required to have array-allocated a large number of the actuators, a light switch for switching a number of signals, and an electrical switch serving the same purpose. These were serious problems.

SUMMARY OF THE INVENTION

The present invention has been made in view of the above-described problems and has an object to provide an electrostatic actuator that enables manufacturing electrostatic actuator devices which are reliable as the mass-production goods, and the characteristics of which are uniformly qualified, while they have the merit of the inclination structure.

To attain the above object, a first feature of the present invention is that, in an electrostatic actuator comprising an upper structure that is connected, via an arm, to a supporting base provided on a substrate and is supported in a space existing over the substrate, a lower structure that is provided in a substrate position in such a way as to oppose the upper structure, an inclination structure that is provided with respect to either one of the upper structure and the lower structure so as to make small the distance between the upper structure and the lower structure, and one or more electrodes that are provided with respect to the other structure in corresponding relationship to the inclination structure, by a voltage being applied between the electrode and a structure having the inclination structure, the upper structure is inclined toward the lower structure side.

A second feature of the present invention is that the electrode is provided with respect to a flat surface of the other structure.

A third feature of the present invention is that an insulating film is provided on the flat surface of the other structure; and, on the insulating film, the electrode is formed using an electrically conductive material.

A fourth feature of the present invention is that the other structure having the flat surface is constructed of a semiconductor material and the electrode is formed on the surface of this structure by using a material having a conductivity type opposite to that of the semiconductor material.

A fifth feature of the present invention is that the electrode is provided on the opposite surface of the mutually opposing surfaces of the upper structure and the lower structure.

A sixth feature of the present invention is that the substrate is of a glass substrate.

A seventh feature of the present invention is that each of the supporting base and the arm is constructed such that two pieces thereof constitute one set; the arm has the function of a torsion spring and the upper structure is supported by the arms; and there are provided the two or more electrodes, so that, by switching the electrode to which a voltage is applied, the direction in which the upper structure is inclined is controlled.

DESCRIPTION OF THE PREFERRED EMBODIMENTS

Hereinafter, an example of the present invention will be explained in detail with reference to the accompanying drawings. In the present invention, in an electrostatic actuator (a micro-structural device, especially an electrostatically driven type actuator), the electrode pattern is formed not on the side of the substrate having an inclination structure but on the side of the other substrate. This other substrate is either the one which is flat or, even when it is not flat, the one which does not have a protruding configuration, such as an inclination structure, in its region having performed with respect thereto patterning. Accordingly, that electrode pattern can be formed exactly as in the form of a photo-mask by the use of an ordinary photolithography. On the other hand, the substrate having an inclination structure is designed such that the entire inclination structure may have one equal potential and, therefore, it is not necessary to form any electrode pattern on the inclination structure substrate side. For this reason, it becomes possible to supply the devices whose characteristics are uniformly qualified while an effective use is being made of the merit that is brought about from the utilization of the inclination structure.

Figure 1A:
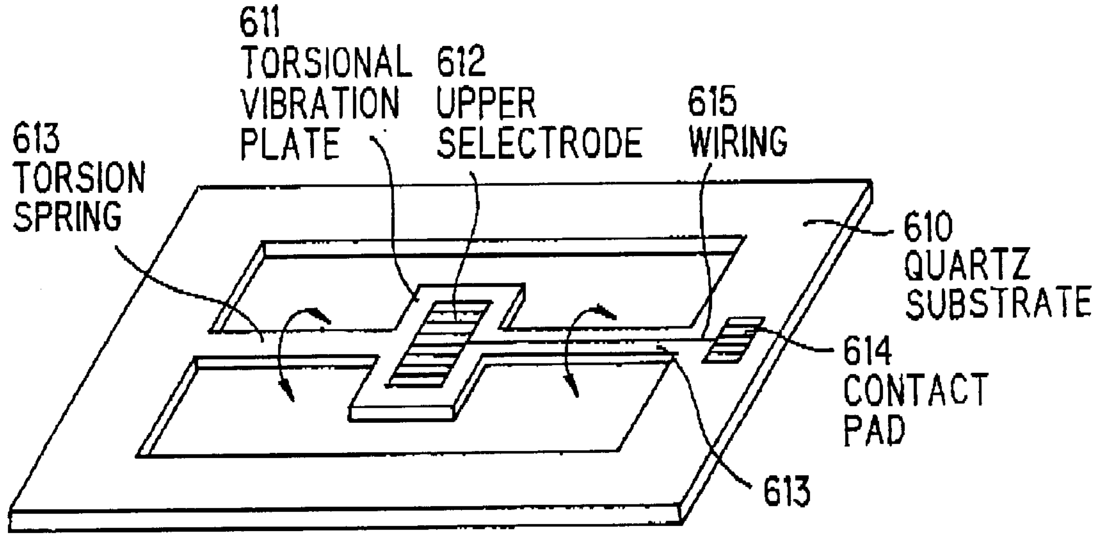
FIG. 1A PRIOR ART
FIGS. 1A and 1B are perspective views illustrating a construction, for reference, in a related conventional technique.
Figure 1B:
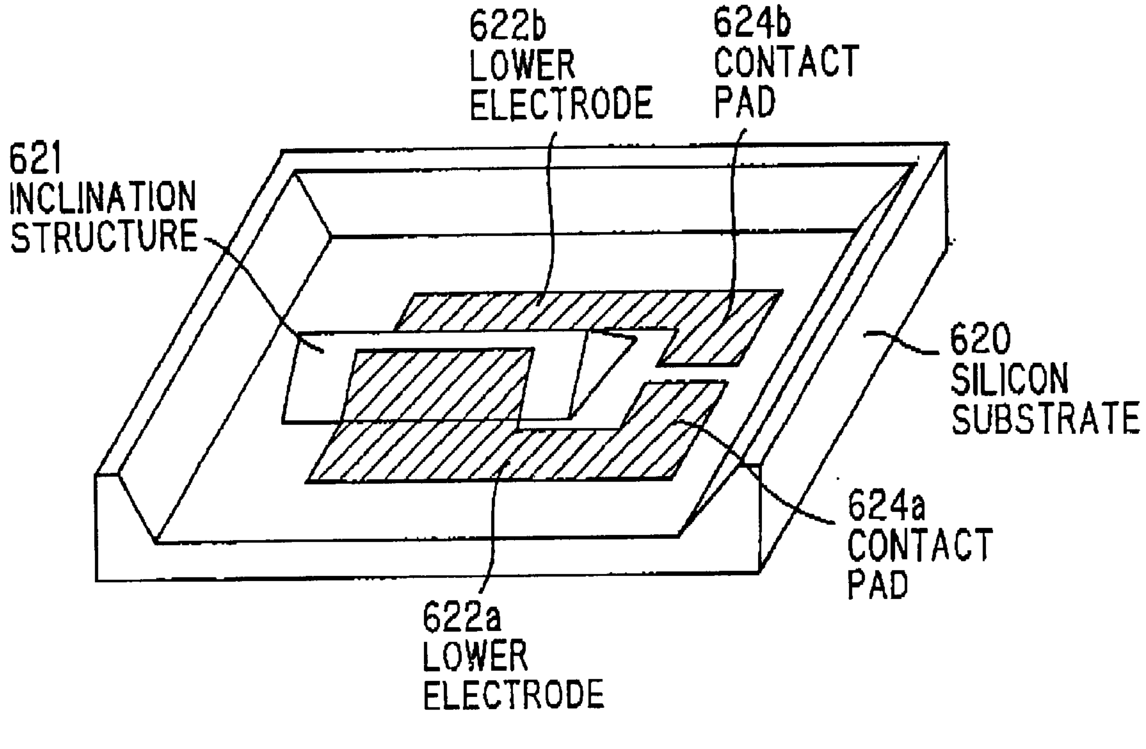
FIG. 1B PRIOR ART
Figure 2A:
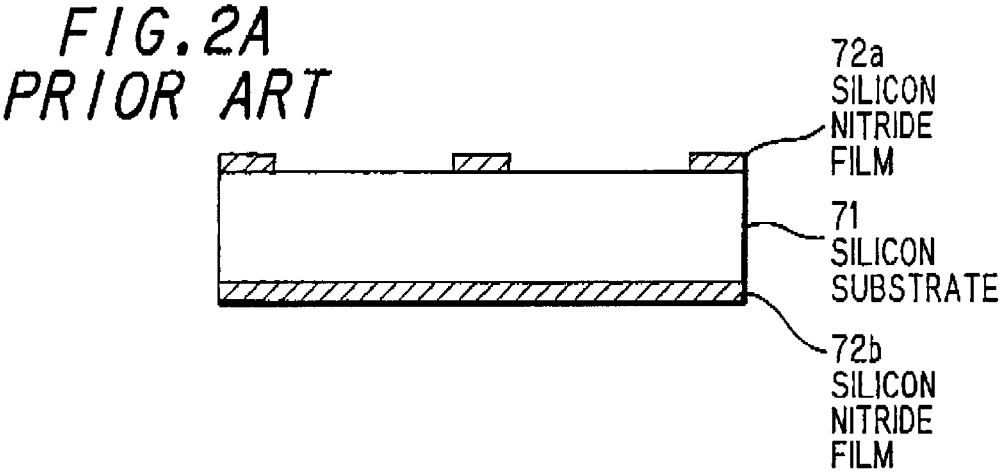
FIG. 2A PRIOR ART
FIGS. 2A to 2D are views illustrating a method of manufacturing, for reference, in the related conventional technique.
Figure 2B:
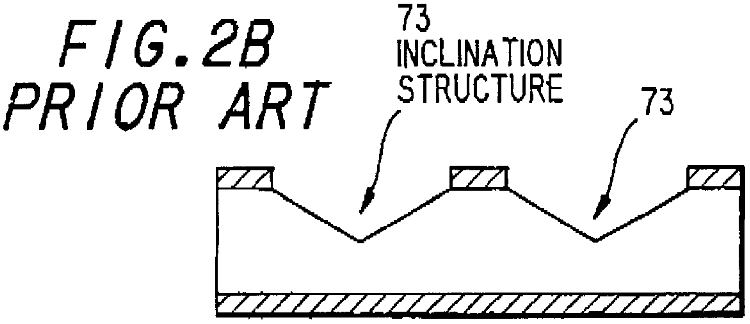
FIG. 2B PRIOR ART
Figure 2C:
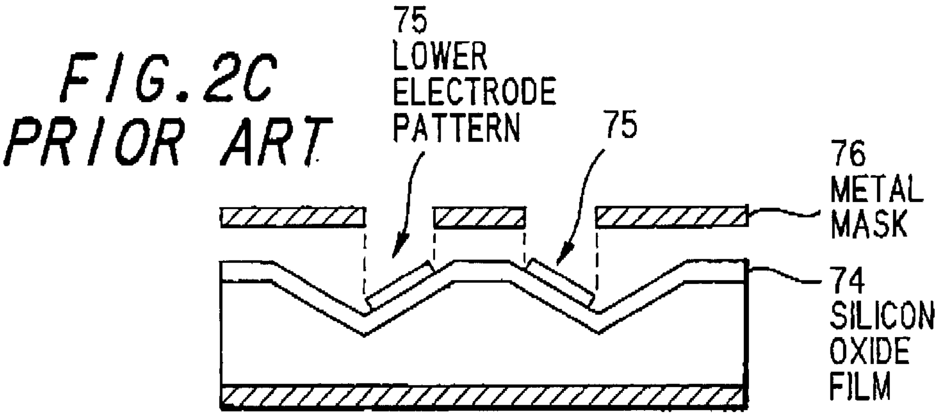
FIG. 2C PRIOR ART
Figure 2D:
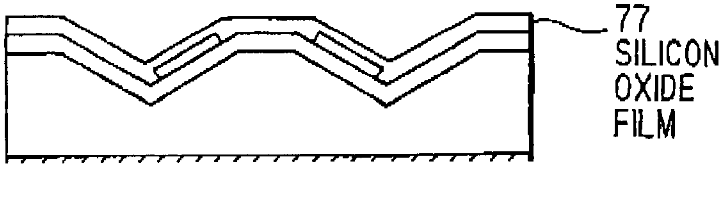
FIG. 2D PRIOR ART
Figure 3A:
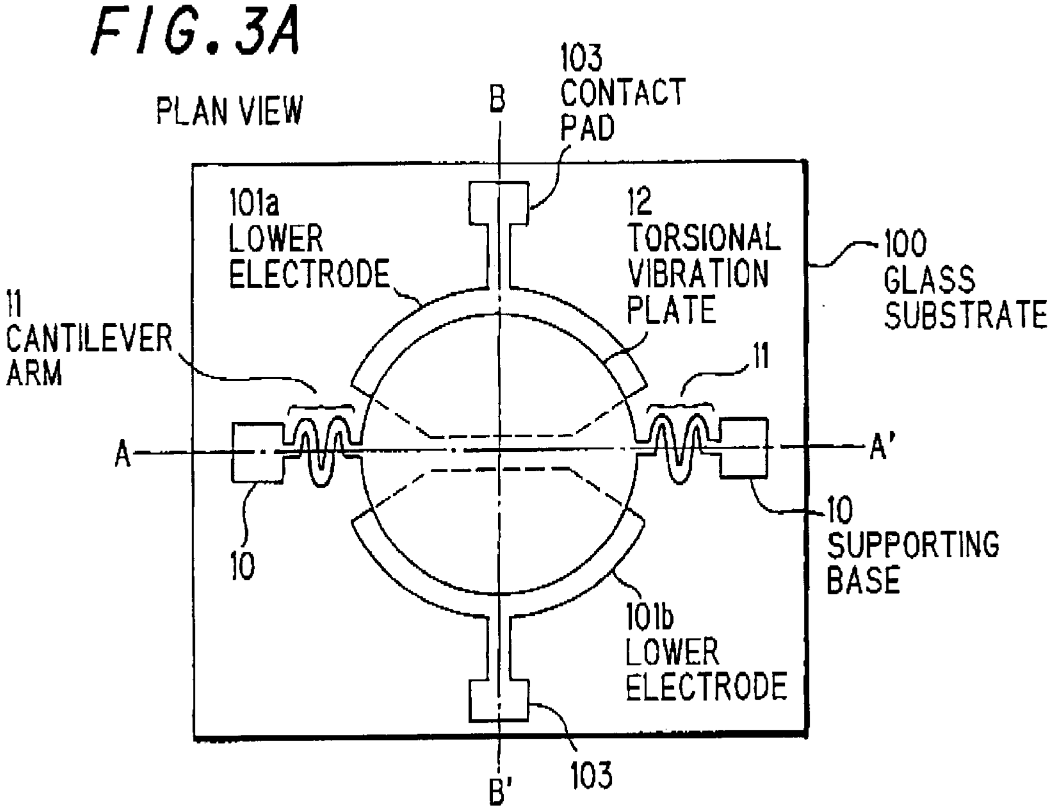
FIGS. 3A to 3C are views (plan view and sectional views) illustrating the structure of an electrostatic actuator according to a first example of the present invention.
Figure 3B:
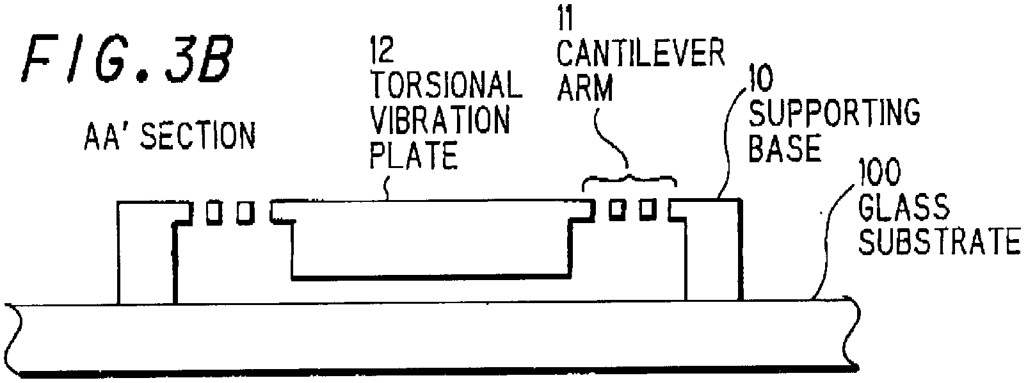
Figure 3C:
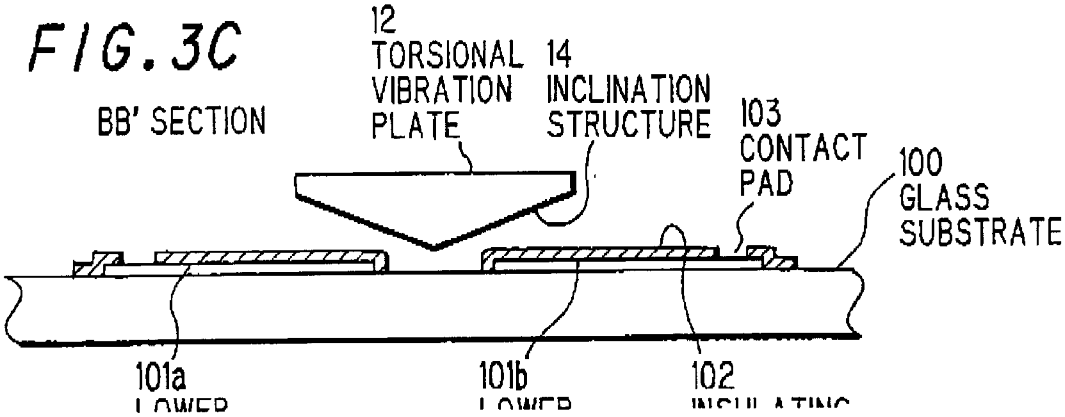
Figure 4A:
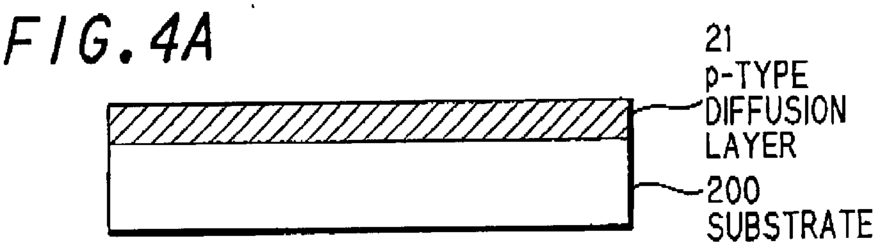
FIGS. 4A to 4E are views (manufacturing process step views) illustrating a method of manufacturing the electrostatic actuator according to the first example of the present invention.
Figure 4B:
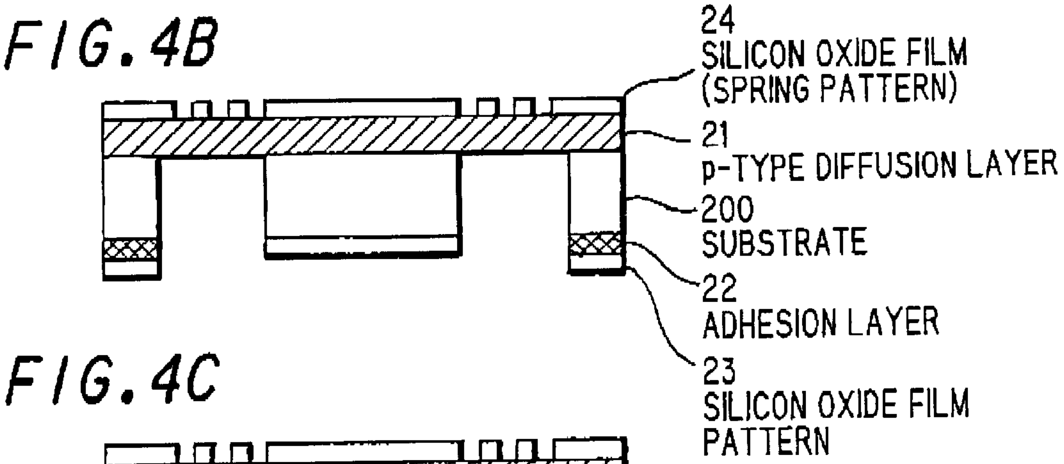
Figure 4C:
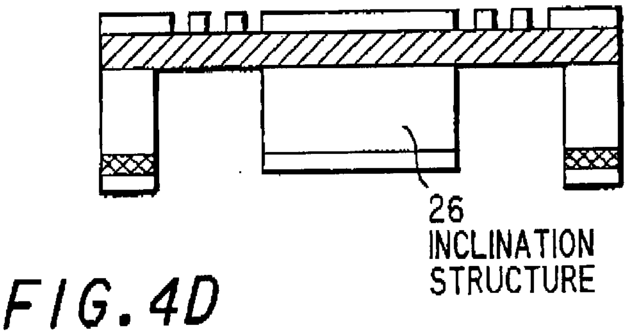
Figure 4D:
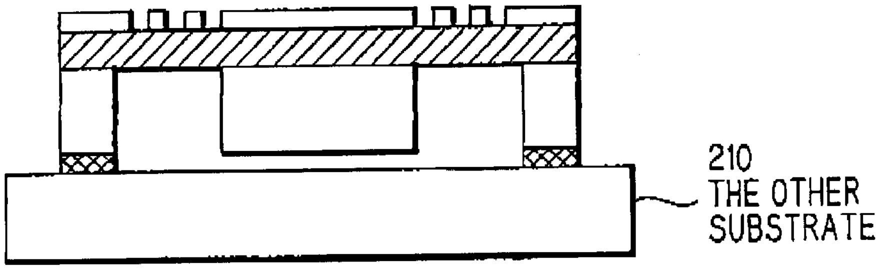
Figure 4E:
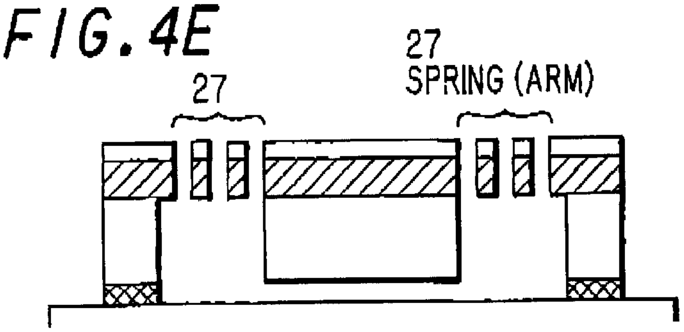

FIGS. 3A, 3B and 3C are views illustrating the structure of an electrostatic actuator according to a first example of the present invention. FIG. 3A illustrates a plane structure that has been viewed from above. An AA' section and BB' section of FIG. 3A are respectively illustrated in FIGS. 3B and 3C. In the present invention, on a glass substrate 100, there are provided supporting bases 10 consisting of silicon and lower electrodes 101*a* and 101*b* each consisting of a titanium/gold material. From one end of each of the two supporting bases 10, there are extended a cantilever arm 11 consisting of silicon, which is connected to a corresponding one of both ends of a torsional vibration plate 12. The torsional vibration plate is thereby supported in the space over the substrate 100.

The pair of cantilever arms 11 play the role of supporting the torsional vibration plate 12 in the space over the substrate and also each play the role of a torsion spring. For making the spring rigidity of the torsion small while suppressing the dimension of the entire device to a smaller value, the cantilever arm 11 is designed to have, as illustrated in FIG. 3A, a structure that when viewed from above is bent. This configuration is only an example. The cantilever arm 11 can also be designed to have a linear, etc. structure as in the case of the prior art. The torsional vibration plate 12 can be rotated about the axis of these cantilever arms 11 (this will be described later). Further, the torsional vibration plate 12 has on its underside an inclination structure 14 as illustrated in FIG. 3C. This inclination structure 14 is disposed in the way in which its inclined surfaces may be located in such a way as to oppose the lower electrodes 101*a* and 101*b*, respectively.

In general, the surface of the torsional vibration plate 12 on a side opposite to the side thereof on which the torsional vibration plate 12 opposes the glass substrate 100 is required to have a flatness. For example, in a case where applying the present invention to a light micro-switch, that surface of the torsional vibration plate 12 is used as a mirror for reflecting a light. At this time, when making the thickness of the torsional vibration plate 12 great, the rigidity thereof becomes high, and, therefore, it has the feature that, even when it is rotated, its flatness can be maintained. Therefore, that offers a convenience. On the other hand, regarding the cantilever arm 11, making the rigidity thereof low serves to decrease the applied voltage for the rotation. For this reason, in this example, the actuator has been made up into a structure wherein the thickness of the torsional vibration plate 12 and the thickness of the cantilever arm 10 are made different from each other.

Also, an insulating film 102 consisting of silicon dioxide, silicon nitride, or the like is formed on the lower electrodes 101*a* and 101*b*. This is for the purpose of preventing electrical short-circuiting from occurring when the torsional vibration plate 12 and the lower electrode 101 contact with each other. That insulating film 102, further, also has a function to prevent the both from adhering to each other. At a part of the insulating film 102, a contact pad 102 is formed. Through this pad, a voltage can be applied to the lower electrode 101. Incidentally, the insulating film 102 does not always need to be formed on the lower electrode 101 as in the case of this example. Namely, it may be provided on the lower side surface of the torsional vibration plate 12, further, it may also be formed on each of the both. Also, for preventing the adhesion, a concavities/convexities pattern may be provided on the surface, or the surface may be covered by a fluorine-based insulating film.

Regarding the applying of a voltage to the torsional vibration plate 12, by performing electrical connection between the supporting base 10 and an outside power source by, for example, wire bonding, the torsional vibration plate 12 can be made to have a potential equal to that of the power source via the cantilever arm 11. Although, in the electrostatically driven actuator, no current is made to flow therethrough and therefore it is not necessary to make the resistance low, it is also possible to decrease the resistance by constructing each of the supporting base 10, cantilever arm 11, and torsional vibration plate 12 of a silicon with respect to which p-type or n-type impurity implantation has been performed. Furthermore, it is also possible to make electrical conduction between those constituent elements by forming each of those constituent elements by the use of metal material, coating an electrically conductive material such as metal onto the surface thereof, etc. In the latter case, each of the supporting base 10, cantilever arm 11, and torsional vibration plate 12 can be formed using insulating material such as quartz, ceramic, etc.

Also, in this example, the glass substrate 100 has been used as the substrate with respect to which the supporting base 10, cantilever arm 11, and torsional vibration plate 12 are formed. This is because such use provides the feature that it is possible to make use of the electrostatic adhesion between the silicon and the glass. However, the material of the substrate is not limited to glass. Ceramic, metal, or semiconductor substrate can also be used. In a case where using metal or semiconductor substrate, providing an insulating film between the lower electrode 101 and the substrate 100 in advance makes it easy to make an electrical insulation between those both.

When applying a voltage of 0 to 50V between the supporting base 10 and the lower electrode 101*a* or 101*b*, due to the electrostatic attracting force an attractive force, which acts toward the substrate (downside), occurs in the torsional vibration plate 12. As the level of the voltage increases, the rotation of the arm 11 and the rotation of the torsional vibration plate 12 each increase in terms of the angle. By varying the level of the applied voltage or switching the lower electrode to which the voltage is applied, in the above-described way, it is possible to control the rotation angle and rotation direction of the torsional vibration plate 12.

Figure 8A:
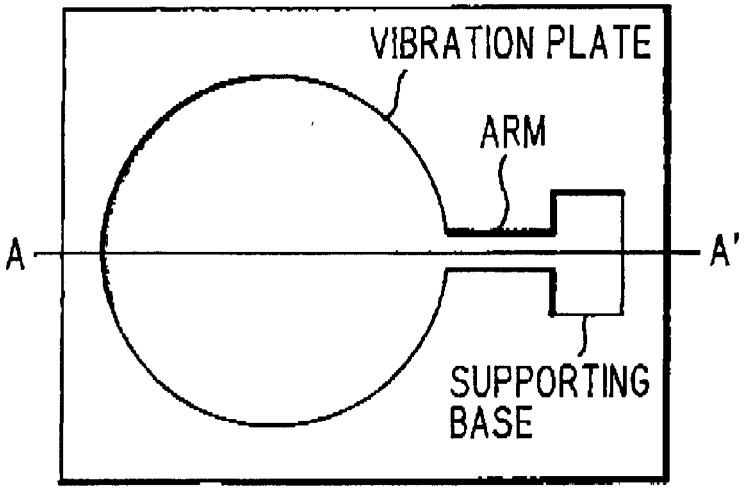
FIGS. 8A to 8C are views illustrating other constructions (the constructions of one arm) of the present invention.
Figure 8B:
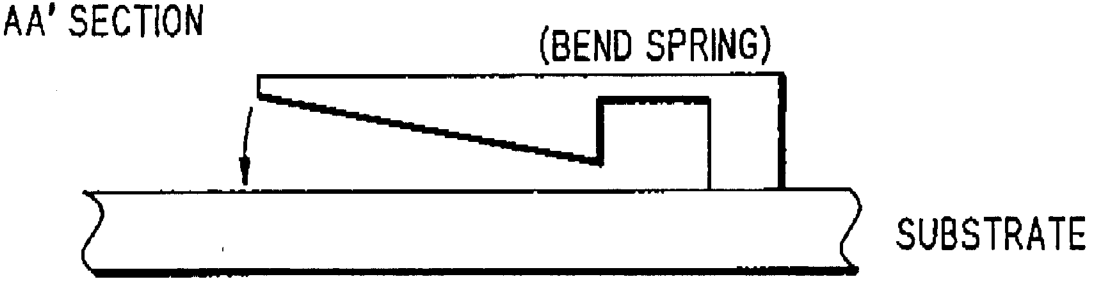
Figure 8C:
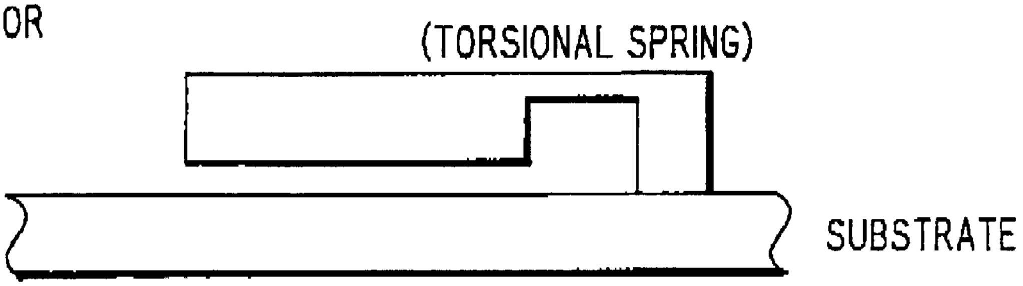

Also, although in this example there has been illustrated a structure wherein a vibration plate 12 is supported, from both sides thereof, by two arms 11 respectively, the present invention is not limited thereto. For instance, as in FIG. 8, the electrostatic actuator according thereto can also be made up into a structure wherein the vibration plate is supported by one arm (the arm connected to one portion of the vibration plate). In this case, by controlling the applied voltage between the upper structure and the lower structure, the vibration plate gets inclined toward the substrate side. In FIG. 8, the arm has the structure, or plays the role, of a bend spring or torsion spring, and, with respect, and correspondingly, thereto, the inclination structure and electrodes are formed according to the subject matter of the present invention.

Also, in the present invention, both of the electrodes 101*a* and 101*b* do not need to be used. According to the use purpose, the actuator may be constructed in the way in which only one side of the electrodes is used or formed. In this case, the inclination structure 14 needs only to be formed with respect to a side that corresponds to the electrode 101.

FIGS. 4A to 4E are views illustrating an example of a method of manufacturing the electrostatic actuator according to the first example of the present invention. These figures are manufacturing process step views each viewed by taking the AA' section up as an example. Here, there is illustrated a case where the structure is formed on the silicon substrate. First boron (B) is diffused 3 μm onto one surface of a silicon substrate 200 the (110) Si crystal face of which serves as the principal surface to thereby form a p-type diffusion layer 21 (the same figure A).

Next, pyrex glass is diffused 3 μm onto the opposite surface of the silicon substrate 200 to thereby form an adhesion layer 22. Subsequently, a silicon oxide film is deposited thereon, and patterning is performed with respect thereto to thereby form an etching pattern 23. On the other hand, a silicon oxide film is deposited onto the surface including the diffusion layer 21, and patterning is performed with respect thereto to thereby form a spring pattern 24 (the same figure B).

Next, the silicon substrate 200 is put into a solution mixture of ethylenediamine/pyrocatechol/water (EPW) to thereby perform anisotropic etching. In this way, etching is performed through the etching pattern 23 and, resultantly, an inclination structure 26 the two inclined surfaces of which each have an angle of inclination of 35.3° is formed. Since the EPW does not etch the diffusion layer 21, it is possible to accurately control the thickness of the diffusion layer 21 becoming a spring (the same figure C).

The silicon oxide film 23 is removed, and the silicon substrate 200 is electrostatically adhered to another silicon substrate 210 having already formed with respect thereto the lower electrode pattern, etc. (not illustrated) (the same figure D). At this time, the glass adhesion layer 22 is bonded to the silicon substrate 210, thereby a firm adhesion therebetween is realized.

Subsequently, via the spring pattern 24, etching within a plasma which uses a gas such as SF6 is performed with respect to the diffusion layer 21 to thereby form a spring 27 (the same figure E). Finally, the silicon oxide film 24 is removed by performing etching within a plasma which uses a gas such as CH4 with respect thereto.

In this example, the dimensions of main constituent elements of the electrostatic actuator are as follows. The arm 11 has a dimension of 5 μm in width, 100 μm in length, and 3 μm in thickness and the torsional vibration plate 12 has a dimension of 500 μm in diameter, 20 μm in minimum thickness, and 35.3° in inclination structure with respect to the plane. The lower electrode 101 is formed in such a way as to be located approximately 10 μm outside the torsional vibration plate 12 and this low electrode 101 is made of a titanium/gold material that is 0.3 μm in thickness. On this lower electrode 101, an insulating film 102 is provided with a thickness of 0.3 μm. The supporting base 10 has a height of 80 μm, thereby it is arranged that even when the torsional vibration plate 12 is rotated ±10° it does not contact with the lower electrode 101.

Figure 5A:
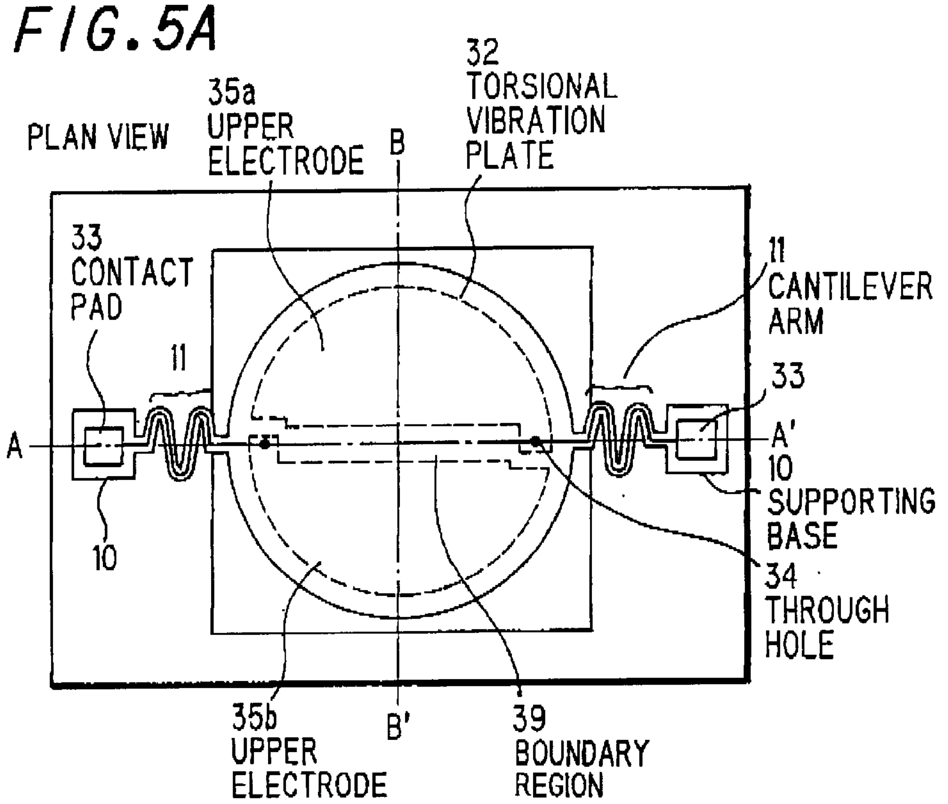
FIGS. 5A to 5C are views illustrating the structure of the electrostatic actuator according to a second example of the present invention.
Figure 5B:
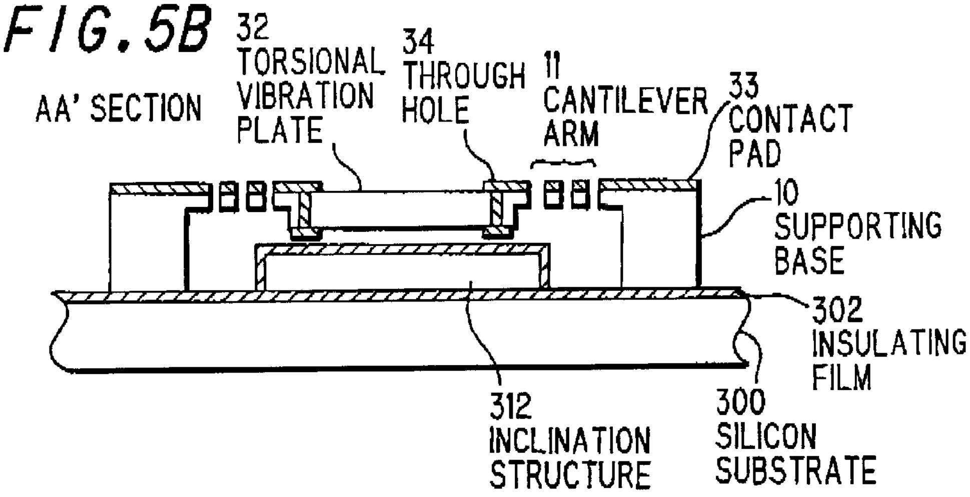
Figure 5C:
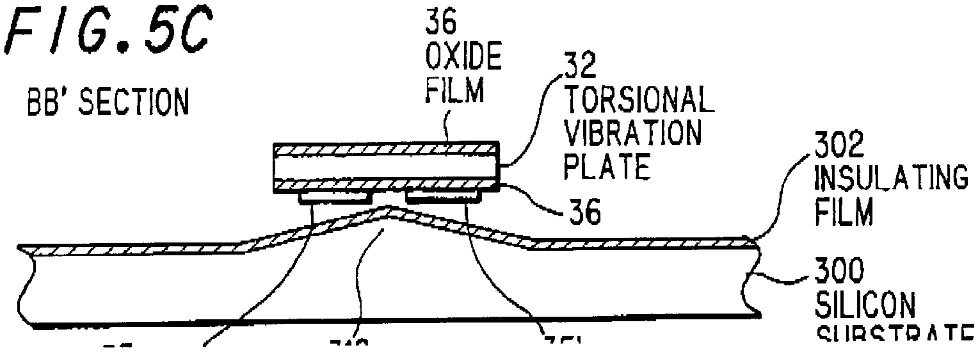
Figure 6A:
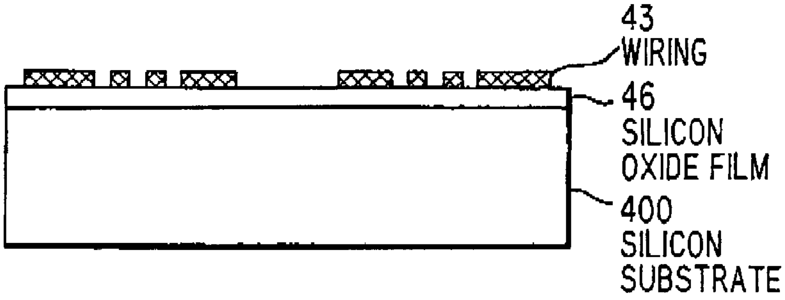
FIGS. 6A to 6E are views illustrating a method of manufacturing the electrostatic actuator according to the second example of the present invention.
Figure 6B:
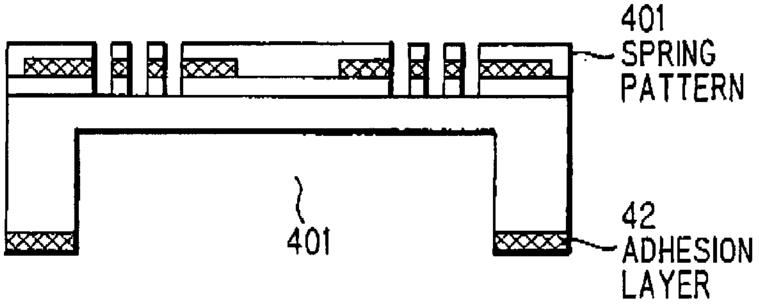
Figure 6C:
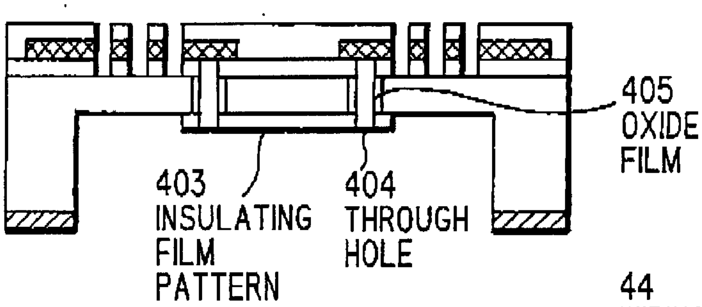
Figure 6D:
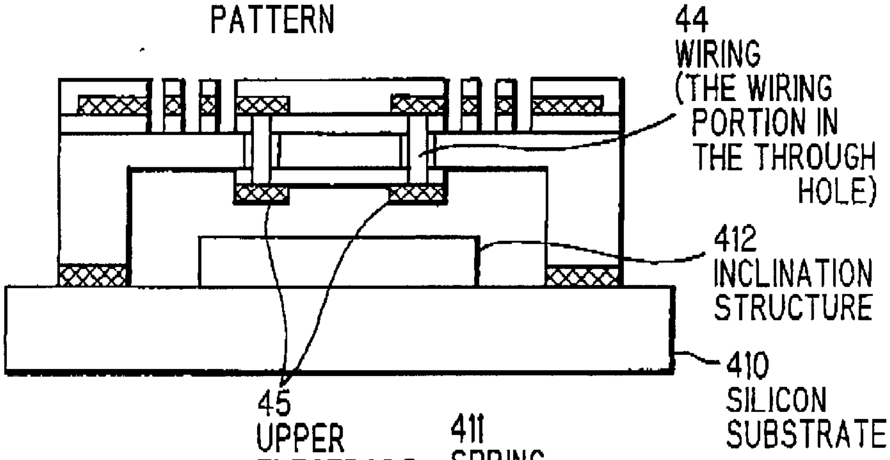
Figure 6E:
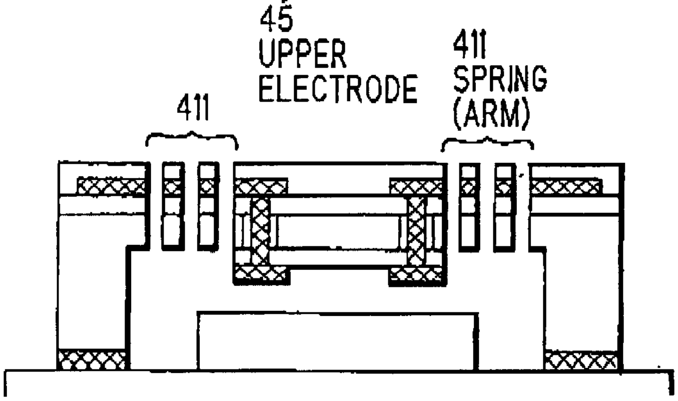

FIGS. 5A, 5B, and 5C are views illustrating the structure of the electrostatic actuator according to a second example of the present invention. FIG. 3A illustrates a plane structure that has been viewed from above. Also, the AA' section and BB' section of the same figure A are illustrated, respectively, as the 3B and 3C. In the same figures, the elements having the same numbers as those of the elements in the first example are the same constituent elements as those in the first example. In the second example, the inclination structure 312 is formed on the silicon substrate 300 side. Also, the second example greatly differs from the first example in that the upper electrodes 35*a* and 35*b* are formed on the torsional vibration plate 32 side.

In the second example, the inclination structure 312 is formed on the silicon substrate 300. However, unlike the convention technique, the lower electrode pattern is not formed on this inclination structure 312 but the inclination structure as a whole serves as one equipotential electrode. Also, on the inclination structure 312, the insulating film 302 is provided for preventing the occurrence of electrical short-circuiting. On the other hand, unlike the first example, the torsional vibration plate 32 is designed to have a configuration having no inclination structure. The surfaces on both sides of the torsional vibration plate 32 are covered by an oxide film 36 (FIG. 5C). On one surface (the lower side surface in FIG. 5) of this oxide film 36 there are formed the upper electrodes 35*a* and 35*b*.

For putting the electrical wiring of those upper electrodes 35*a* and 35*b* on the upside of the torsional vibration plate 32, through holes 34 are formed in part of the torsional vibration plate 32. Through these through holes 34, the wiring of the upper electrodes 35*a* and 35*b* are connected via the upper surfaces of the cantilever arms 11 to the contact pads 33 provided on the supporting bases 10. The side walls of the through holes 34 are covered with oxide films (not illustrated), thereby it is arranged that electrical short-circuiting be prevented from occurring between the wiring of the upper electrodes 35*a* and 35*b* and the torsional vibration plate 32.

Regarding the connection of the silicon substrate 300 to the power source, it can be performed either by removing a part of the insulating film 302 on that surface and using this removed part as the connection opening or by using, and via, the reverse surface of the substrate 300. By applying a voltage between the substrate 300 and one of the contact pads 33, it is possible to rotate the torsional vibration plate.

Incidentally, in this example, although there has been illustrated as an example the case where the upper electrodes 35*a* and 35*b* are formed on the lower side surface of the torsional vibration plate 32, the upper electrodes 35*a* and 35*b* may be formed on the upper side surface of the torsional vibration plate. In this case, there is the merit that the structure becomes simplified because there is no need to provide the through holes 34. In addition, since in the electostatic actuator it is not necessary that electric current be made to flow therethrough, it is not necessary that the resistance be made small. And, therefore, the regions of the supporting base 10, cantilever arm (spring) 11, and upper electrodes 35*a* and 35*b* of the torsional vibration plate 32 can be also made of a semiconductor material having performed with respect thereto impurity implantation the impurity of that has a type (conductivity type) different from that in the case of the boundary region 39 between the upper electrode 35*a* and the upper electrode 35*b*. At this time, providing the upper electrodes 35*a* and 35*b*, and, also, providing the metal wiring on the spring 11, become unnecessary. Removing the metal wiring away from over the spring 11 is very effective from the standpoint of forming the spring 11 as designed.

Also, the torsional vibration plate 32, spring 11, and supporting base 10 are not limited to silicon material. Each of these elements can also be made using metal material, or, for example, coating electrically conductive material such as metal onto the surface of the insulating material such as quartz, ceramic, etc. Also, in this example, the silicon substrate 300 has been used as the substrate with respect to which the supporting bases 10, arms 11, and torsional vibration plate 32 are formed. This is because the feature exists that it is possible to form the inclination structure 312 utilizing the anisotropic etching technique with respect to the silicon. However, the material of that substrate is not limited to silicon. It is also possible to use ceramic, metal, or other semiconductor material.

The representative dimensions of the second example are approximately the same as those illustrated in the above-described first example.

FIGS. 6A to 6E illustrate the method of manufacturing the electrostatic actuator according to the second example. First, on one surface of the silicon substrate 400 the (100) Si crystal face of which serves as the principal surface, there is formed a silicon oxide film having a thickness of 0.5 $\mu$m. And, on that silicon oxide film, a 0.2 $\mu$m thickness of titanium/gold thin film is deposited to thereby form a wiring 43 for electrical connection (the same figure A).

On this wiring 43 for electrical connection, a silicon oxide film is deposited by; the use of a plasma CVD technique, and a spring pattern 401 is formed using an ordinary photolithography. On the opposite surface of the substrate 400, pyrex glass is diffused 3 $\mu$m an patterning is performed with respect thereto, to thereby form an adhesion layer 42. Subsequently, using this adhesion layer 42 as a mask, the silicon substrate 400 is plasma-etched by the depth of approximately 80 $\mu$m with a gas such as SF6 to form a groove 402 (the same figure B).

In the surface of the silicon substrate 400 on a side where the groove 402 exists, using a resist mask, through holes 404 are formed by silicon dry etching. And, on that surface, a silicon oxide film is deposited by the plasma CVD technique, to thereby form an insulating film pattern 403 through the use of oxide film dry etching. At this time, an oxide film 405 is formed on the side wall, as well, of the through hole 404 (the same figure C).

Subsequently, on this resulting surface, sputtering of titanium/gold is performed to the thickness of 1 $\mu$m to thereby perform embedding with respect to the through holes 404. And, patterning is performed with respect to this titanium/gold film to thereby form the upper electrode pattern 45. On the other hand, using a silicon substrate 410 the (110) Si crystal face of which serves as the principal surface, there is formed an inclination structure 412 through the performance of anisotropic etching with respect to that substrate. After covering this surface with a silicon oxide film, this silicon substrate 410 and the silicon substrate 400 are electrostatically adhered to each other. At this time, the glass adhesion layer 42 plays the role of an adhesive material (the same figure D).

Finally, with respect to the silicon substrate 400, etching is performed within a plasma using a gas such as SF6 through the intermediary of the spring pattern 401 to thereby form springs 411. Also, part of the spring pattern 401 is etched to cause a part of the wiring 43 for electrical connection to be exposed and thereby make that part the contact pad 33 (the same figure E).

In this manufacturing method, the photolithography for forming the upper electrode 45 within the silicon groove 402 is used. However, since the bottom surface of the groove 402 is flat, it is possible to form the electrode pattern much more easily and much more accurately than to form the pattern on the side surface of the inclined surface as was inevitably so in the prior art.

Figure 7A:
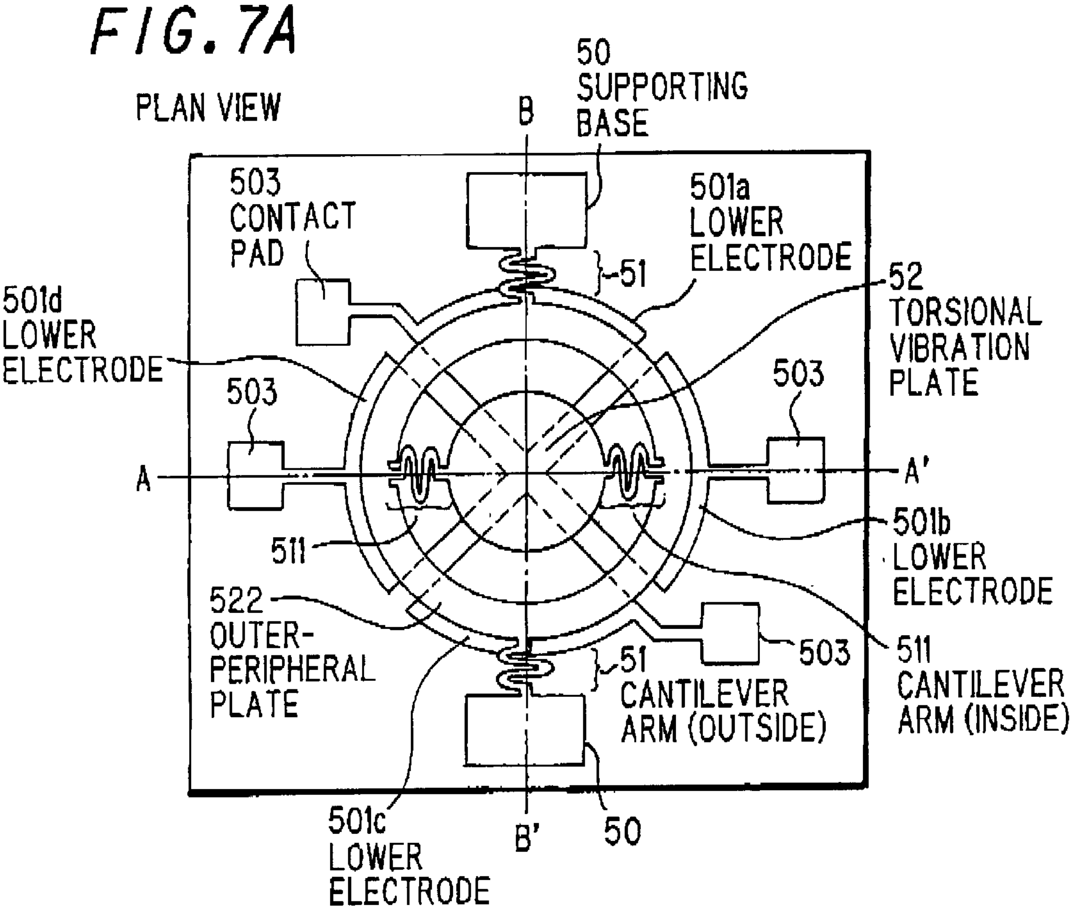
FIGS. 7A to 7C are views illustrating the structure of the electrostatic actuator according to a third example of the present invention.
Figure 7B:
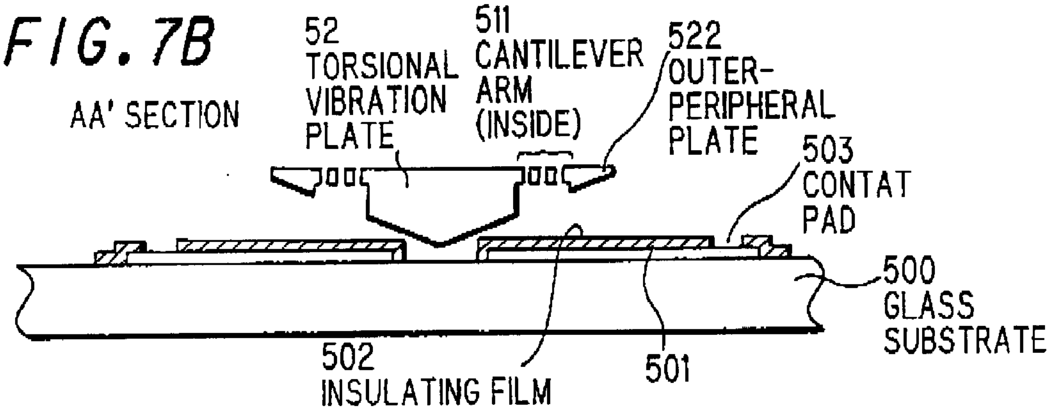
Figure 7C:
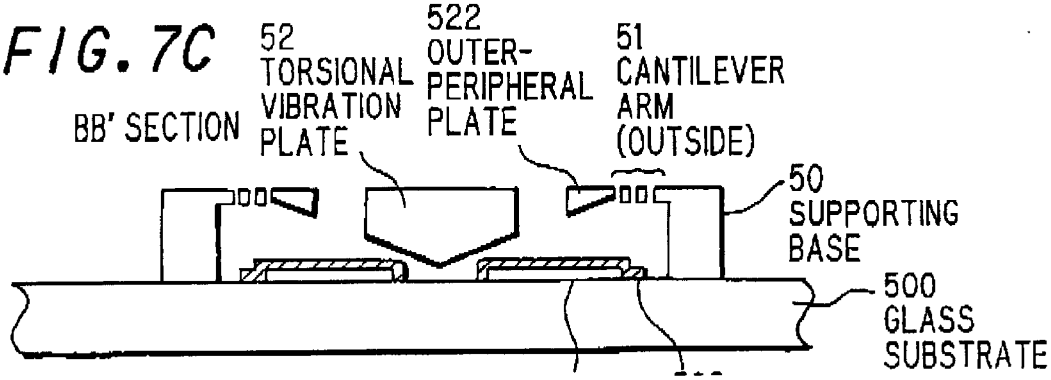

FIGS. 7A, 7B, and 7C are views illustrating the structure of the electrostatic actuator according to a third example of the present invention. FIG. 7A is a plan view that has been viewed from above. Also, the AA' section and BB' section in the same figure are illustrated respectively in FIGS. 7B and 7C. In this third example, the torsional vibration plate 52 is supported by two pairs of arms, that is, a pair of arms 51 and a pair of arms 511, through the intermediary of an outer-peripheral plate 522. By performing rotation control by causing rotation of the torsional vibration plate about the axis of each of the two pairs of arms, it is arranged that the two-dimensional inclination control of the torsional plate 52 can be performed. In this respect, this third example greatly differs from the first and second examples.

In the third example, on the glass substrate 500, the supporting bases 50 consisting of silicon and four lower electrodes 501*a*, 501*b*, 501*c*, and 501*d* consisting of titanium/gold material are provided. From one end of the supporting bases 50 there are extended the cantilever arms 51 consisting of silicon, which are connected to both ends of the outer-peripheral plate 522, in addition, inside the outer-peripheral plate 522 the cantilever arms 511 consisting of silicon are provided at the positions perpendicular to those of the arms 51. Those cantilever arms 511 are connected to both ends of the torsional vibration plate 52, respectively, and support it in the space over the glass substrate 500. For making small the spring rigidity of the torsion while suppressing the dimension of the device as a whole to a small value, the cantilever arms 511 and 51 are each formed into a bent structure as illustrated in the same figure A. Of course, the cantilever arm can also be made up into a structure of being linear as in the prior art.

The torsional vibration plate 52 can be rotated about the center axis of each of the pair of arms 51 and the pair of arms 511, in the directional ways that are perpendicular to each other. Further, the torsional vibration plate 52 and outer-peripheral plate 522 each have an inclination structure 53 on its four sides as illustrated in FIGS. 7B and 7C. This inclination structure 53 is constructed and disposed such that its inclined surfaces may oppose the lower electrodes 501. In general, the surface of the torsional vibration plate 52 on a side opposite to the side thereof on which the plate 52 is faced to the glass substrate 500 side is required to have a flatness. For example, in a case where applying the present invention to a light mirror, that obverse surface of the torsional vibration plate 52 becomes a mirror causing reflection of the light. At this time, increasing the thickness of the torsional vibration plate 52 makes the rigidity thereof greater, and this conveniently provides the feature that even when the plate 52 is rotated, its flatness is maintained as is. On the other hand, regarding the cantilever arms 51 and 511, it is better to make the rigidity thereof small. This is because that serves to decrease the voltage applied for causing the rotation. For this reason, in this example, there has been illustrated a structure wherein the thickness of the torsional vibration plate 52 is made different from the thickness of the cantilever arms 51 and 511.

Also, an insulating film 502 consisting of an insulating film made of silicon dioxide or silicon nitride is formed on the lower electrode 501. The reason for this is to prevent electrical short-circuiting from occurring when the torsional vibration plate 52 or outer-peripheral plate 522 and the lower electrode 501 have gotten contacted with each other. In addition, that insulating film 502 has the function of preventing those both from adhering together. At a part of the insulating film 502 there is formed a contact pad 503. By making electrical connection between the lower electrode 501 and the power source through the intermediary of that pad 503, a voltage can be applied to the lower electrode 501. Incidentally, it is not always necessary to form the insulating film 502 with respect to the lower electrode 501 as in this example. The insulating film 502 may also be provided on the downside of the torsional vibration plate 52 and outer-peripheral plate 522. Further, that film 502 may also be provided with respect to those both. In addition, for preventing the both from adhering together, concavities/convexities may be provided with respect to the surface, or this surface may also be covered by an insulating film consisting of a fluorine-based material.

Applying a voltage to the torsional vibration plate can be done as follows. With respect to the supporting base 50, electrical connection with an outside power source is performed, for example, by wire bonding. By doing so, through the cantilever arm 51 and 511, the torsional vibration plate 52 can be made equal in level to the potential of the power source. In the electrostatic actuator, no electrical current is made to flow therethrough. Therefore, there is no need to make the resistance small. However, by constructing each of the supporting base 50, cantilever arm 51 and cantilever arm 511, torsional vibration plate 52, and outer-peripheral plate 522 with silicon with respect to which implantation of an impurity of p-type or n-type has been performed, it is also possible to make the resistance low. Further, each of those elements can also be made electrically conductive by forming it using metal material or by coating an electrically conductive material such as metal with respect to the surface of it. In the latter case, it is possible to form each of the supporting base 50, cantilever arms 51 and 511, torsional vibration plate 52, and outer-peripheral plate 522 by using insulating material such as quartz, ceramic, etc.

Also, in this example, as the substrate having formed with respect thereto the supporting base 50, cantilever arms 51, 511, torsional vibration plate 52, and outer-peripheral plate 522, the glass substrate 500 has been used. This is because there is the feature that it is possible to utilize the electrostatic adhesion between the silicon and the glass. However, the present invention is not limited to glass. As that substrate, it is also possible to use ceramic, metal, semiconductor material, etc. In a case where using a metal substrate or a semiconductor substrate, only if providing an insulating film between the lower electrode 501 and the substrate 500 beforehand, electrical insulation can easily be made between those both.

Applying a voltage of 0 to 50V between the supporting base 50 and any one of the four lower electrodes 501*a* to 501*d*, an attractive force, which acts toward the substrate (the downside) occurs in the torsional vibration plate 52 and outer-peripheral plate 522 due to the electrostatic attracting force. With an increase in the level of the voltage, in corresponding relationship to the lower electrode 501 to which a voltage is applied, the rotation of the arm 51 and outer-peripheral plate 522, or of the arm 511 and torsional vibration plate 52, becomes increased in terms of the rotation angle. By varying the level of the voltage applied, or switching the lower electrode 501 having a voltage applied thereto, in the above-described way, it is eventually possible to control the rotation angle and rotation direction of the torsional vibration plate 52.

The method of manufacturing the electrostatic actuator according to the third example is basically the same as that in the case of the first example illustrated in FIG. 4, except the inclination structure 53 has four inclined surfaces. For forming this structure, for example, the following measure can be taken. With respect to a silicon substrate whose (110) Si crystal face serves as the principal surface, there is formed a square pattern that goes along the (100) Si crystalline-axial direction. Then, etching is performed with respect to the resulting substrate by using an anisotropic etching solution such as EPW. When doing so, it is possible to form a structure that is surrounded by four inclined surfaces each having an inclination angle of 45°.

The representative dimensions of the third example are as follows. The arms 51 and 511 each have a width of 5 $\mu$m, a length of 100 $\mu$m, and a thickness of 3 $\mu$m; and the torsional vibration plate 52 has a diameter of 500 $\mu$m, a minimum thickness of 20 $\mu$m, and an inclination structure of 45. Also, the outer-peripheral plate 512 has a concentric configuration with a diameter of 550 $\mu$m and a diameter of 700 $\mu$m. The lower electrode 501 is formed so as to be located approximately 10 $\mu$m outside from the outer-peripheral plate 512 and is made of a titanium/gold material having a thickness of 0.3 $\mu$m. On that lower electrode 501, there is provided the insulating film 502 with a thickness of 0.3 $\mu$m. The supporting base 10 has a height of 130 $\mu$m and it is arranged that they do not contact with the lower electrode 501 even when the torsional vibration plate 52 and outer-peripheral plate 512 are each rotated ±10°.

Incidentally, although in this third example the inclination structure 53 has been formed on the substrate side (on the upper structure) as in the first example, it is also possible to form that inclination structure 53 on the substrate side (the lower structure) the same as that in the case of the second example.

In the examples of the present invention, a structure wherein the upper electrode or lower electrode is divided into two or four parts has been illustrated. However, the number of the electrode parts is not limited thereto. Even when the number of the electrode parts is greater than that, obtaining the effect of the present invention is possible. In addition, regarding the applying of a voltage with respect to that plurality of electrode parts, even when applying with respect to several ones of them at the same time, or even when using the method wherein a voltage is first applied to a certain one of them and thereafter the voltage is applied to another one of them, it is possible to obtain the effect of the present invention.

Also, it is not necessary to make equal the length of the arms 51 and that of the arms 511 according to the third example, nor is there any need to make same the angles of the inclined surfaces of the inclination structure 53. For instance, in a case where constructing in the way of making the rotation about the AA' of the FIG. 5A ±10° and making the rotation about the BB' of it ±5°, making the rigidity of the arm 51 higher, or making the angle of the corresponding inclined surface small, etc., is also effective.

Also, it is also effective to form holes in the torsional vibration plate 52 and outer-peripheral plate 522 and thereby decrease the squeeze effect resulting from the air existing between those elements and the lower electrode 501. Or there may also be used a method of forming holes in part of the lower electrode 501 and the substrate 500 located thereunder and thereby obtaining the same effect. In the present examples, since the thickness of the vibration plate is greater than that of the spring (arm), it is easy to reinforce the strength of the structure. Therefore, even when the interior has formed therein a plurality of holes, the rigidity of the movable part as a whole can be maintained sufficiently high.

A micro device having a structure such as that which has been described in detail in the above-described examples can be applied to a light switch, DC-to-high-frequency switch, and antenna in the below-mentioned way. In a case where using that micro device as a light switch, it is possible to deposit, for example, a 0.2 μm thickness of gold on the surface of the torsional vibration plate and thereby make it the reflecting film (mirror) At this time, if the upper electrode is provided on the torsional vibration plate, for preventing electrical short-circuiting from occurring between this upper electrode and that reflecting film an insulating film can be inserted between the upper electrode and the reflecting film or the patterns of those both which exist when viewed from above can be separated from each other. By doing so, it is possible to easily realize such prevention of electrical short-circuiting. Also, in the case of the use purpose in which that micro device is used as a DC-to-high-frequency switch, a contact electrode can be provided on the downside of the torsional vibration plate, thereby the contact electrode can be contacted or non-contacted with the signal line provided on the lower substrate. This offers a good level of convenience. Further, in the case of the use purpose with respect to a high frequency device such as an antenna, it will offer a convenience if forming a co-planar circuit pattern on the upside surface of the torsional vibration plate.

In the above-described use purposes with respect to a light switch and antenna, because the pattern is formed on the flat surface on the upside of the torsional vibration plate, it is possible to perform accurate patterning by using an ordinary technique of photolithography. On the other hand, in the use purpose with respect to DC-to-high-frequency switch, because the contact electrode is formed on the surface, which is not flat, on the downside of the torsional vibration plate, the problem that it is impossible to form an accurate pattern remains. However, it is the positional relationship between the lower/upper electrodes and the inclination structure and the configurations thereof that have an effect upon the device characteristic with a high sensitivity. The configuration and location of the contact electrode do not highly sensitively have an effect upon it. Therefore, it is possible to form an excellent-characteristic device with respect to each of those various kinds of use purposes.

The examples of the present invention have been explained as described above. It is to be noted that the above-described examples are illustrative of the preferred examples of the present invention. The present invention is not limited thereto but permits various changes or modifications to be made without departing from the subject matter of the invention.

As apparent from the foregoing explanation, according to the present invention, since an effective use can be made of the electrostatic attracting force resulting from the use of the inclination structure, it becomes possible to decrease approximately 30% the applied voltage in comparison with the planar structure. Further, if constructing in the way of making the angle of the inclined surface small, it is also possible to decrease the applied voltage down to a half, or less than the half, of the voltage which is applied in case of the planar structure. Furthermore, since the upper electrode or lower electrode is formed on the flat surface, it is possible to accurately form the electrode pattern and therefore to mass-produce and supply the devices having a uniform level of quality. Therefore, the accuracy with which the rotation angle of the vibration plate is controlled in corresponding relationship to the voltage applied thereto is remarkably enhanced.

Because the above-described advantages have been brought about, the electrostatic actuator of the present invention becomes able to be applied not only to switches that simply are used individually loosely but also to new use purposes such as a faced array antenna required to have actuators integrated on a large area of substrate in the order of several tens of thousands of pieces, a light cross connect switch, etc. The above-described advantages or effects are very remarkable.

What is claimed is:

1. An electrostatic actuator comprising:

an upper structure that is connected, via an arm, to a supporting base provided on a substrate and is supported in a space existing over the substrate;

a lower structure that is provided in a substrate position in such a way as to oppose the upper structure;

at least one of the upper or the lower structure having an inclination structure that protrudes towards the opposing structure; and one or more electrodes positioned opposite to the inclination structure;

wherein by a voltage being applied between the electrode and the structure having the inclination structure, the upper structure is deflected toward the lower structure side.

2. An electrostatic actuator according to claim 1, wherein the electrode is disposed upon a flat surface of at least one of: the upper structure and the lower structure.

3. An electrostatic actuator according to claim 2, wherein an insulating film is provided on the flat surface; and, on the insulating film, the electrode is formed using an electrically conductive material.

4. An electrostatic actuator according to claim 2, wherein the structure having the flat surface is constructed using a semiconductor material and the electrode is formed on the surface of this structure by using a material having a conductivity type opposite to that of the semiconductor material.

5. An electrostatic actuator according to claim 1, wherein the substrate is a glass substrate.

6. An electrostatic actuator according to claim 1, wherein each of the supporting base and the arm is constructed such that two pieces thereof constitute one set; the arm acting as a torsion spring and the upper structure is supported by the arm; and there are provided the two or more electrodes, so that, by switching the electrode to which a voltage is applied, the direction in which the upper structure is inclined is controlled.

* * * * *